United States Patent [19]

Braat

[11] Patent Number: 5,757,017
[45] Date of Patent: May 26, 1998

[54] IMAGING SYSTEM AND APPARATUS FOR ULTRAVIOLET LITHOGRAPHY

[75] Inventor: Josephus J. M. Braat, Eindhoven, Netherlands

[73] Assignee: U.S. Philips Corporation, New York, N.Y.

[21] Appl. No.: 803,737

[22] Filed: Feb. 21, 1997

[30] Foreign Application Priority Data

Mar. 7, 1996 [EP] European Pat. Off. .............. 96200619

[51] Int. Cl.$^6$ ...................................................... G02B 5/18
[52] U.S. Cl. ................................................... 250/492.2
[58] Field of Search ........................... 250/492.2, 492.1, 250/504 R; 354/359, 361, 487, 572

[56] References Cited

U.S. PATENT DOCUMENTS

| | | | |
|---|---|---|---|
| 4,320,936 | 3/1982 | Sawamura | 350/1.6 |
| 4,846,552 | 7/1989 | Veldkamp et al. | 250/492.1 |
| 5,166,529 | 11/1992 | Ando et al. | 250/492.2 |
| 5,420,436 | 5/1995 | Seya et al. | 250/492.2 |
| 5,510,230 | 4/1996 | Tennant et al. | 250/492.2 |

OTHER PUBLICATIONS

Edited by E.D. Palik, "Handbook of Optical constants of Solids", Academic Press Inc., 1985, pp. 451–464.

E. Spiller et al, "Controlled fabrication of multilayer soft-–x–ray mirrors", Appl. Phys. Lett. 37(11), 1 Dec. 1980, pp. 1048–1050.

Primary Examiner—Kiet T. Nguyen
Attorney, Agent, or Firm—Anne E. Barschall

[57] ABSTRACT

An imaging system with at least one reflective surface for forming an image by means of ultraviolet radiation, the reflective surface being provided with a correction layer which is transparent to the wavelength of the radiation used. This layer compensates for phase differences caused by deviations of form of the reflective surfaces. The correction layer has a refractive index which differs only slightly from 1, so that the requirements imposed as regards the precision of the surface of the transparent layer are significantly less severe than for the reflective layer.

5 Claims, 2 Drawing Sheets

IMAGING SYSTEM AND APPARATUS FOR ULTRAVIOLET LITHOGRAPHY

The invention relates to an imaging system for forming an image of an object by means of ultraviolet radiation, which system includes at least one surface which is reflective for the wavelength of the radiation used.

The invention also relates to a lithography apparatus including such an optical system, wherein the object is a lithographic mask, or reticlle, which is imaged on a semiconductor substrate, or wafer, provided with a resist layer.

For the manufacture of integrated electronic circuits and tools, such as masks to be used for said manufacture, optical systems must be available whereby the circuit patterns to be formed can be imaged with a resolution much higher than the order of magnitude of the smallest detail of said patterns to be imaged. For the circuit patterns to be formed at present the details to be imaged are of the order of magnitude of 0.25 µm and it is commonly expected that in the near future there will be a need for details of the order of magnitude of 0.1 µm and even less.

Contemporary optical systems for imaging these pattern details utilize visible light whose wavelength is between approximately 0.4 µm and 0.7 µm. If even smaller details are to be imaged, exposure by means of ultraviolet light having a wavelength of up to approximately 0.2 µm is required. It has already been proposed to perform microlithography by means of ultraviolet light of extremely short wavelength; this is usually referred to as EUVL. In the context of the present invention ultraviolet radiation is to be understood to mean electromagnetic radiation whose wavelength is between 0.4 µm and 5 nm. Radiation with a wavelength of the order of magnitude of 13 nm is to be preferred because for such a wavelength range reflectors can be manufactured which are highly reflective at substantially perpendicular incidence can and comprise a number of layers of molybdenum (Mo) and silicon (Si). Reflectors of this kind are described in an article by E. Spiller et al.: "Controlled Fabrication of Multilayer Soft X-Ray Mirrors", Appl. Phys. Lett. 37, pp. 1048–1050 (1980).

A restriction encountered when using imaging systems suitable for wavelength ranges smaller than 0.1 µm is posed by the manufacturing precision of the reflecting surfaces to be used in these systems. If a quality is desired for the form of these surfaces such that the image has a diffraction limited quality, for each individual reflective surface of the system only a form deviation (RMS) smaller than approximately 1 nm is still permissible. Further, in order to keep the dispersion of the surfaces below a level of the order of approximately 1% per surface, the surface roughness should be less than approximately 0.1 nm. When customary surface working techniques are used (for example, local polishing using soft polishing agents, milling by means of a diamond tool or polishing by means of ion beams (ion beam polishing)), it is not or only hardly possible to keep the form accuracy as well as the surface roughness within the required limits.

It is an object of the invention to provide an imaging system for wavelengths of less than 0.1 µm in which said requirements as regards manufacturing accuracy are satisfied at moderate costs and labour. To achieve this, the optical system according to the invention is characterized in that said at least one reflective surface is provided with a correction layer for correcting form inaccuracies of the reflective surface, which correction layer is transparent to the wavelength of the radiation used, has a refractive index which differs at the most 10% from that of the surrounding medium and has a variable thickness, adapted to said form inaccuracies.

The invention is based on the recognition that by using a material with such small refractive index, and thus low optical contrast, the required accuracy can be obtained by local deposition of layer elements, or removing elements of a layer, of such material, which elements have a thickness which is a factor f, for example in the order of 100, larger than the local inaccuracies of the reflective surface. Due to the low optical contrast the thickness accuracy of the layer elements needs to be only 1/f of the accuracy required for a reflective surface without the correction elements. The total of the deposited elements or the layer from which elements have been removed is called the correction layer. While for reflectors not provided with a correction layer the required quality can not, or only at high costs and much labour, be obtained, for reflectors provided with a correction layer this quality can be obtained, or in a considerably easier way, respectively.

The invention is also based on the recognition of the fact that in said wavelength range a substantial number of materials have a complex refractive index $\tilde{n}=n-i\kappa$ (where i is the imaginary unit) whose real part n and imaginary part κ have a value such that the ratio of phase shift to absorption of the wavefront to be reflected has a value which is acceptable for practical applications as will be described in detail hereinafter.

In a preferred embodiment of the invention the real part of the refractive index of the protection layer is at the most 10% larger than that of the surrounding medium. As will be explained hereinafter, in this range of the refractive index an optimum thickness of the correction layer with respect to compensation of deviations of form and to absorption of the radiation used can be obtained.

In a further embodiment of the invention, the imaginary part of the refractive index of the correction layer is less than 0.005 for the wavelength of the radiation used. As will be described in detail hereinafter, in this range of the complex refractive index the thickness of the correction layer can be further optimized for compensation of deviations of form.

The invention also relates to a lithographic apparatus comprising, in this order, a radiation source for delivering a rojection beam, a mask stage, an imaging system for imaging a mask present in the mask holder on a substrate and a substrate holder for carrying the substrate. This apparatus is characterized in that the imaging system is a system comprising reflective surfaces as described above.

These and other aspects of the invention will be apparent from and elucidated with reference to the embodiments described hereinafter.

Figure 1A:
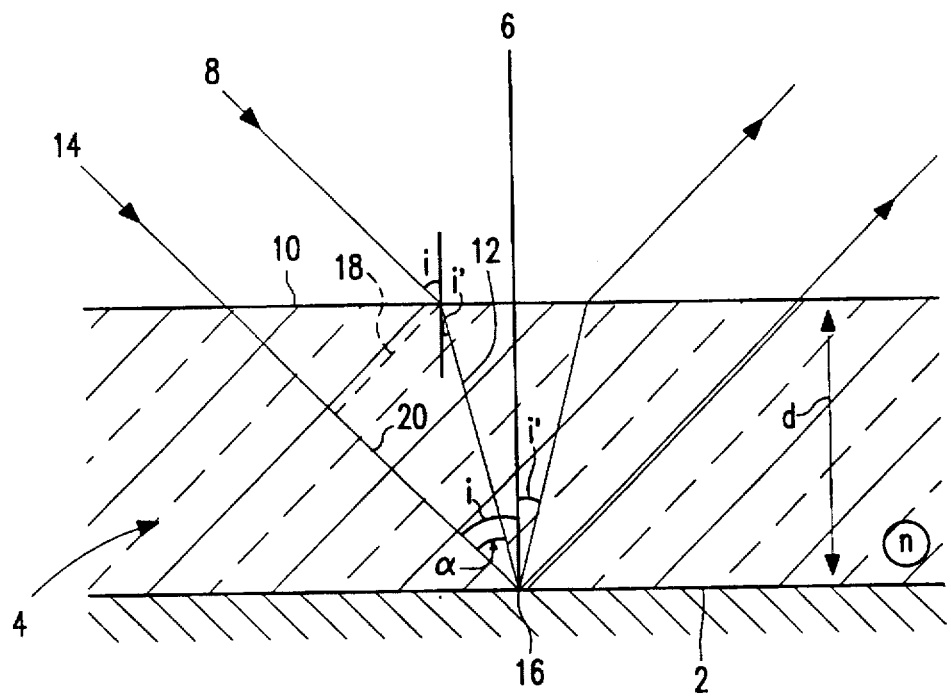
FIG. 1a is a first auxiliary for the explanation of the relationship between the thickness of a surface layer and a deviation of form to be corrected.
Figure 1B:
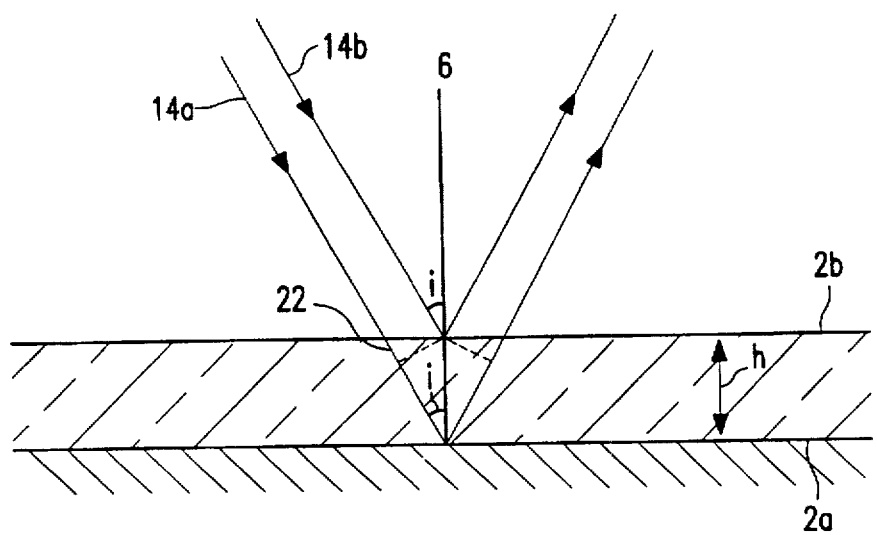
FIG. 1b is a second auxiliary for the explanation of the relationship between the thickness of a surface layer and a deviation of form to be corrected.

Figs. 1a and 1b constitute auxiliaries in clarifying the phase difference occurring when a lightwave is reflected on a reflective surface covered by a transparent surface layer in comparison with the situation where the lightwave is reflected directly on a non-covered reflective surface.

FIG. 1a shows diagrammatically a reflective surface 2 which is covered by a transparent surface layer 4 which has a thickness d and a refractive index n. An incident light ray 8 is refracted by the surface 10 of the surface layer 4 and subsequently follows an optical path 12 of a length $S_m$ in the medium 4. This light ray its subsequently reflected by the reflective surface 2 at the point 16, again follows an optical path of a length $s_m$, and subsequently emanates from the surface layer 4.

FIG. 1a also shows the optical path which would be followed in the absence of a transparent surface layer. The Figure shows a light ray 14 which is reflected at the same point 16 on the reflective surface as the light ray 8. Evidently, the light ray is not refracted and continues rectilinearly after reflection. The phase difference between the two light rays 8 and 14, induced by the traversing of the surface layer, will be determined hereinafter.

At the area of the normal 18 to the light rays 8 and 14, the phase difference between these light rays equals zero. For the length $S_d$ of the part 20 of the path followed by the light ray 14, traveling directly to the reflective surface, it holds (with $\alpha=i-i'$) that:

$$\cos \alpha = \cos(i - i') = \frac{s_d}{s_m} = \frac{s_d \cos i'}{d} \tag{1}$$

in which i is the angle between the normal 6 to the surface of the medium 4 (and to the reflective surface 2) and the incident rays 8 and 14, and i' is the angle between the normal 6 and the ray 8 after diffraction on the surface 10. For the length $S_d$ of the path 20 it is found, after rewriting of the expression (1) and writing out of cos(i-i'), that $$s_d = \frac{d \cos(i - i')}{\cos i'} = d \left\{ \frac{\cos i \cos i' + \sin i \sin i'}{\cos i'} \right\} \tag{2}$$

wherefrom it follows, using the law of refraction sin i=n sin i' and the known relation sin i'=√(1-cos²i'), that:

$$s_d = d \left\{ \cos i + \frac{n\{1 - \cos^2 i'\}}{\cos i'} \right\} = d \left\{ \cos i + \frac{n}{\cos i'} - n \cos i' \right\} \tag{3}$$

From the expression (3) for the length $S_d$ of the part 20 the phase variation $\Delta\phi_d$ occurring in the light ray 14 while following the optical path 20 can be calculated via the relation $\Delta\phi_d=(2\pi S_d)/\lambda_0$ (in which $\lambda_0$, is the wavelength of the radiation used in vacuum, i.e. outside the medium 2):

$$\Delta\phi_d = \frac{2\pi d}{\lambda_0} \cos i + \frac{2\pi n d}{\lambda_0 \cos i'} - \frac{2\pi n d}{\lambda_0} \cos i' \tag{4}$$

For the path length $s_m$ travelled by the light ray 12 in the medium 4 it holds that:

$$s_m = \frac{d}{\cos i'} \tag{5}$$

From the expression (5) for the path length $s_m$, the phase variation $\Delta\phi_m$ occurring in the light ray 8 while following the optical path 12 can be calculated via the relation $\Delta\phi_m = (2\pi n s_m)/\lambda_0$:

$$\Delta\phi_m = \frac{2\pi n}{\lambda_0} \cdot \frac{d}{\cos i'} \tag{6}$$

Expression (6) is the same as the second term in the right-hand part of the expression (4), so that the expression (6) can be inserted into the expression (4), yielding the expression $\Delta\phi$ for the difference between the phase variation $\Delta\phi_d$ and the phase variation $\Delta\phi_m$:

$$\Delta\phi = \Delta\phi_d - \Delta\phi_m = \frac{2\pi d}{\lambda_0} \cos i - \frac{2\pi n d}{\lambda_0} \cos i' = \frac{2\pi d}{\lambda_0} \{\cos i - n \cos i'\} \tag{7}$$

For the expression (7) an approximative expression can be derived, assuming that the refractive index n for the wavelength range and the medium used deviates only slightly from 1. Using the law of refraction sin i=n sin i', it then follows from the expression (7) that:

$$\cos i - n \cos i' = \frac{1 - n}{\cos i'} \tag{8}$$

and when the expression (8) is inserted into the expression (7) it follows that:

$$\Delta\phi = \frac{2\pi d}{\lambda_0} \left\{ \frac{1 - n}{\cos i'} \right\} \tag{9}$$

The expression (9) represents the phase difference $\Delta\phi$ occurring because a light ray of wavelength $\lambda_0$ traverses a medium having a thickness d and a refractive index n (n≈1). The latter situation can be compared with the situation where a light ray is reflected on a part of a reflective surface which, because of a deviation of form, is not situated in the desired position but in a position which has been shifted a distance h with respect to the desired position. This situation is shown diagrammatically in FIG. 1b.

FIG. 1b shows a reflective surface part 2a which is situated in a desired position. The reference 2b denotes a surface part which is situated in a location which has been shifted over a distance h with respect to the part 2a. It is assumed that a light ray 14a is incident on the surface 2a; this ray is compared with a light ray 14b incident on the surface 2b. FIG. 1b clearly shows that upon traveling the distance h, the following holds for the path difference 22 between the rays 14a and 14b which is denoted by the reference s:

$$s = h \cos i \tag{10}$$

From the expression (10) for the path length s the phase difference $\Delta\phi_h$ between the light rays 14a and 14b, occurring over the distance h, can be calculated via the relation $\Delta\phi=(2\pi s)/\lambda_0$.

$$\Delta\phi_h = \frac{2\pi s}{\lambda_0} = \frac{2\pi h \cos i}{\lambda_0} \tag{11}$$

When the height difference h, occurring due to the deviation of form of the reflective surface, must be compensated by the presence of a transparent surface layer element on said reflective surface, the phase difference caused by the presence of the surface layer (see expression (9)) must be equal to the phase difference caused by the height difference h (see expression (11)). Equation of the expressions (9) and (11) then yields:

$$\frac{2\pi h}{\lambda_0} \cos i = \frac{2\pi d}{\lambda_0} \left\{ \frac{1 - n}{\cos i'} \right\} \tag{12}$$

which can be simplified to:

$$h \cos i \cos i' = d(1 - n) \tag{13}$$

For most practical situations it may be assumed that cos i and cos i' are both approximately 1, i.e. that the light is incident at a small angle with respect to the surface normal, that is to say in a medium having a refractive index which deviates only slightly from 1. The latter expression shows that the height difference h can be compensated by means of a transparent layer of a thickness d which may be 1/(1−n) times greater than the height difference h. (Incidence of the light at a substantially larger angle can be represented simply by an additional factor in the expression (13). This does not affect the validity of the foregoing conclusion.)

The above can be summarized as follows. If a wavefront is incident perpendicularly on a reflective surface at a position where the surface has a height deviation h, this wavefront will suffer a phase pertubation $\Delta\phi_h$ given by:

$$\Delta\phi_h = \frac{2\pi}{\lambda} \cdot 2h$$

This phase pertubation can be compensated by local deposition of an element, or by removing an element of a layer of transparent material having a refractive index n. Such element element with thickness d introduces a phase shift given by:

$$\Delta\phi = \frac{2\pi}{\lambda} \cdot d(n-1)$$

For compensation $\Delta\phi$ should be equal to $\Delta\phi_h$, which results in:

$$\frac{2\pi}{\lambda} \cdot 2h = \frac{2\pi}{\lambda} \cdot d \cdot (n-1)$$

or:

$$d = \frac{1}{n-1} \cdot h = f \cdot h$$

If n has a value near to 1, the factor f will be large and and the correction layer will have a low optical contrast in the wavelength range of interest. For compensating a reflector surface deviation h a correction layer element with a thickness much lager than h can be used. Because of the low optical contrast of the correction layer a height deviation in this layer has a much smaller influence on the wavefront than a same deviation in the reflective surface.

For a wavefront which is incident at an angle i with the normal to the reflective surface and the layer, the factor f shouls be replaced by a factor $f_i$:

$$f_i = \frac{1}{n-1} \cdot \cos i \cdot \cos i'$$

as explained hereinbefore.

Providing the reflective surface with the transparent correction layer has also the effect that the roughness of the final reflective surface becomes 1/f times the original roughness of the uncovered reflector surface. Up to now it has been assumed that the medium surrounding the reflective surface is clean air, having a refractive index equal to 1. It is however possible that the surrounding medium has a refractive index which differs from 1. In that case, n in the above expressions should be replaced by: $n_2-n_1$, wherein $n_2$ is the refractive index of correction layer and n, that of the medium.

Figure 2:
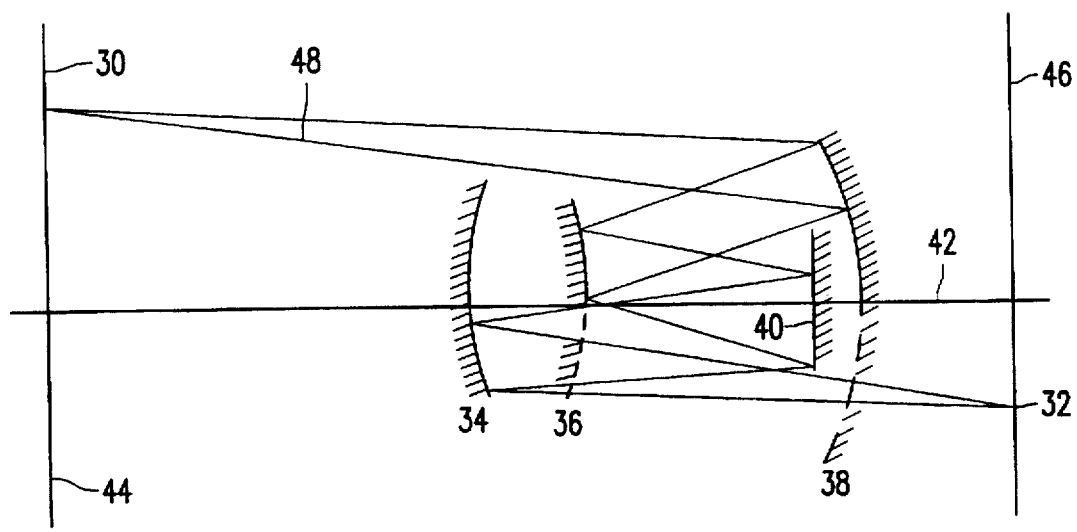
FIG. 2 shows diagrammatically an optical system for forming an image for lithographic purposes.

FIG. 2 shows diagrammatically an imaging system as used for the manufacture of electronic integrated circuits by means of microlithography. In this FIG. reference number 30 denotes a point of a mask 44 which constitutes an object plane. The mask is, in a conventional way, fixed in a mask holder arranged in a mask stage, not shown. For lithography with extreme ultraviolet radiation the mask is reflective and is illuminated by an EUV source, not shown, arranged at the left of the mask. The mask can be manufactured in known manner by means of visible light, electron imaging or imaging by means of UV light. For imaging point 30, and all other points, of the mask 44 in a point 32, and other points, respectively on a substrate or wafer 46, an imaging system comprising a number of, for example four, curved reflectors 34,36,38 and 40 is used. A radiation beam 48 from point 30 is successively reflected by the reflectors 38, 36, 40 and 34 towards the substrate 46. This substrate is, in a conventional way, fixed in a substrate holder arranged in a substrate stage, not shown.

The dimension of the smallest detail in the mask is, for example, 1 μm and the imaging takes place with a reduction of, for example, 5×. The smallest detail in the substrate plane 46, therefore, has a dimension of 0.2 μm. In order to achieve the desired resolution for such detail dimension, a number of mirrors is required so as to reduce the aberrations in the image formed by the optical system to a value below a required minimum value. For the desired small detail dimension each of the reflective surfaces must still be formed as an aspherical surface. Moreover, very severe requirements must be satisfied in respect of the accuracy of form and the surface roughness of each of the reflective surfaces. These severe requirements can be satisfied by providing each of the mirrors with a transparent correction layer according to the invention.

In an imaging system with a number of reflectors whose surfaces have only small deviations from the required shapes, it is possible to correct the whole system by providing one reflective surface with a correction layer, which is shaped in accordance to the aberrations of the whole system. If the surface deviations are not very small it is prefered to provide each of the reflective surfaces with a correction layer. A reflective surface close to the diaphragm of the imaging system is particularly suited for correcting the imaging aberrations which are common to all imaging rays. For correcting imaging aberrations which are related to the border rays, i.e. field aberrations, a reflective surface is chosen that is as far as possible from the diaphragm.

Figure 3:
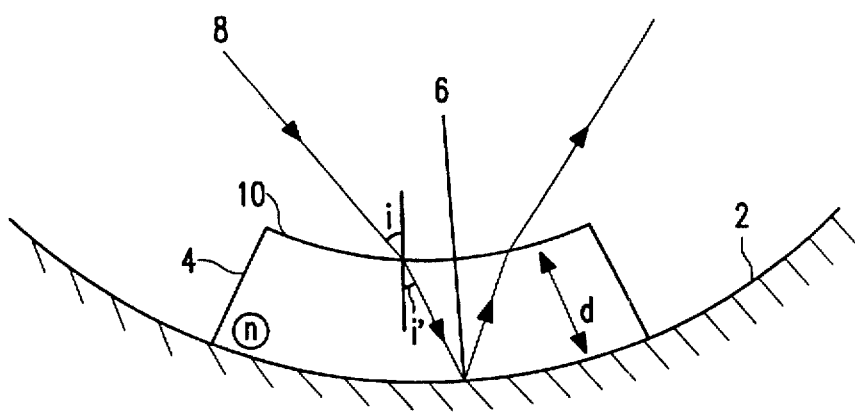
FIG. 3 shows diagrammatically a reflective surface in an optical system, provide with a transparent surface layer.

FIG. 3 shows diagrammatically one reflective surface as used in an imaging system as shown in FIG. 2. In this Figure a reflective surface 2 (which may be one of the surfaces 34, 36, 38 and 40 of FIG. 2) is provided with a transparent surface layer 4 having a refractive index n and a thickness d. A light ray 8 is incident on the surface 10 of the transparent layer 4 at an angle of incidence i. This light ray is reflected on the reflective surface 2 and subsequently emerges from the transparent layer 4 again. The thickness of the transparent layer 4 is limited by the absorption of the UV radiation in this layer. Like the refractive index n, the absorption is dependent on the nature of the material. Generally speaking, the aim is to choose a material having an as low as possible refractive index, so that the optical contrast is as low as, and the layer thickness as large as, possible; any thickness variations in this layer then have a much smaller effect on the imaging quality of the reflector than height variations of the reflective surfacer. However, a large layer thickness also introduces a proportional absorption. Therefore, generally a layer thickness will be pursued which represents an optimum between these two effects. An evaluation of this optimum is based on the complex refractive index $\tilde{n}=n-i\kappa$. The absorption A of the light in a layer thickness d is then given by the expression $$A = 1 - \exp\left\{\frac{-8\pi}{\lambda_0} n\kappa d\right\} \quad (14)$$

For small values of κ the absorption is independent of the angle of incidence i. In conformity with the values of n and κ, therefore, a given phase shift is introduced at the expense of the intensity of the reflected ray. In order to enable evaluation of the optimum thickness, a figure of merit F is defined which may be considered as "the amount of phase shift per amount of absorption", i.e.

$$F = \left|\frac{n-1}{2n\kappa}\right| \quad (15)$$

The modulus sign is inserted in the expression (15) in order to cover situations where n<0. In the Table given hereinafter the following variables are stated for a number of materials and for various wavelengths $\lambda_0$: the real part n and the imaginary part κ of the refractive index ñ, the figure of merit F, and the thickness $d_{1/e}$ at which the intensity has decreased to a value 1/e due to the absorption.

| Material | n | κ | F | $d_{1/e}$ (nm) |
|---|---|---|---|---|
| λ = 13 nm | | | | |
| Si (crystalline) | 1.032 | 0.0010 | 15.5 | 501 |
| Rh | 0.907 | 0.0066 | 7.8 | 86 |
| No | 0.944 | 0.0040 | 7.4 | 137 |
| Polyethylene $(C_2H_4)_n$ | 0.980 | 0.0020 | 5.1 | 263 |
| Si (amorphous) | 1.030 | 0.0030 | 5.0 | 167 |
| Mo | 0.932 | 0.0089 | 4.1 | 62 |
| Be | 0.993 | 0.0012 | 2.9 | 434 |
| λ = 50 nm | | | | |
| Al | 0.809 | 0.0177 | 6.7 | 70 |
| Si (crystalline) | 0.778 | 0.0205 | 7.0 | 32 |
| λ = 80 nm | | | | |
| Al | 0.258 | 0.0777 | 18.5 | 26 |
| λ = 100 nm | | | | |
| Al | 0.034 | 0.7000 | 20.3 | 22 |

This Table shows that the real part of the refractive index is near 1 notably for the shorter UV wavelength of 13nm and that the value of κ is comparatively small. This combination enables a large phase correction in the case of a comparatively large layer thickness of 100 nm or more. In this range crystalline or amorphous silicon is to be preferred. In the case of longer wavelengths (such as 50 nm, 80 nm or 100 mn), aluminium is to be preferred. The data of the above Table have been derived from "Handbook of Optical Constants of Solids", Edited by Edward D. Palik, Academic Press Inc., 1985.

I claim:

1. An imaging system for forming an image by means of ultraviolet radiation of a preselected wavelength, said system including at least one reflective surface which is reflective for said preselected wavelength said at least one reflective surface being provided with a correction layer for correcting form inaccuracies of said at least one reflective surface, said layer being transparent to said preselected wavelength, having a refractive index for said preselected wavelength which differs at the most 10% from that of a surrounding medium and having a variable thickness to correct the form inaccuracies.

2. An imaging system as claimed in claim 1 in which the real part of the refractive index of the correction layer is at the most 10% larger than that of the surrounding medium.

3. An imaging system as claimed in claim 1 in which the imaginary part of the refractive index of the correction layer is less than 0.01 for said preselected wavelength.

4. An imaging system as claimed in claim 1 in which the material of the transparent surface layer is silicon.

5. A lithography apparatus comprising, an ultraviolet radiation source for delivering an ultraviolet projection beam, a mask holder, an imaging system for imaging a mask fixed in the mask holder onto a substrate and a substrate holder for carrying the substrate, wherein the imaging system is a system as claimed in claim 1.

* * * * *